United States Patent
Chu et al.

(10) Patent No.: US 6,424,533 B1
(45) Date of Patent: Jul. 23, 2002

(54) THERMOELECTRIC-ENHANCED HEAT SPREADER FOR HEAT GENERATING COMPONENT OF AN ELECTRONIC DEVICE

(75) Inventors: Richard C. Chu, Poughkeepsie; Michael J. Ellsworth, Jr., Lagrangeville; Robert E. Simons, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,984

(22) Filed: Jun. 29, 2000

(51) Int. Cl.$^7$ ................................................ H05K 7/20
(52) U.S. Cl. .................... 361/719; 29/890.03; 62/3.7; 257/930; 361/704
(58) Field of Search .................... 62/3.2, 3.3, 3.7, 62/259.2; 165/80.3, 185, 65, 104.21; 257/706, 707, 712, 713, 717, 903; 361/717–719, 704, 705, 722, 690; 174/16.3; 29/832, 840, 890.03

(56) References Cited

U.S. PATENT DOCUMENTS

| | | | | |
|---|---|---|---|---|
| 4,279,292 A | * | 7/1981 | Swiatosz ..................... | 165/61 |
| 4,402,185 A | * | 9/1983 | Perchak ........................ | 62/3.3 |
| 4,704,872 A | | 11/1987 | Jones ............................ | 62/3 |
| 4,901,201 A | | 2/1990 | Crowe .......................... | 361/384 |
| 4,914,551 A | | 4/1990 | Anschel et al. ............. | 361/389 |
| 5,032,897 A | | 7/1991 | Mansuria et al. ............ | 357/81 |
| 5,247,426 A | | 9/1993 | Hamburgen et al. ........ | 361/705 |
| 5,457,342 A | | 10/1995 | Herbst, II .................... | 257/712 |
| 5,569,950 A | | 10/1996 | Lewis et al. ................. | 257/467 |
| 5,591,789 A | | 1/1997 | Iruvanti et al. .............. | 523/515 |
| 5,604,978 A | | 2/1997 | Sherif et al. .................. | 29/840 |
| 5,637,921 A | * | 6/1997 | Burward-Hoy ............. | 257/712 |
| 5,712,448 A | | 1/1998 | Vandersande et al. ...... | 136/203 |
| 5,887,435 A | * | 3/1999 | Morton .......................... | 62/3.6 |
| 5,921,087 A | * | 7/1999 | Bhatia et al. .................. | 62/3.2 |
| 5,930,893 A | * | 8/1999 | Eaton ....................... | 29/890.03 |
| 5,982,635 A | * | 11/1999 | Menzies et al. ............. | 361/790 |
| 6,094,919 A | * | 8/2000 | Bhatia .......................... | 62/3.7 |

* cited by examiner

*Primary Examiner*—Gerald Tolin
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

A thermal dissipation subassembly is provided for an electronic device. The subassembly includes a thermal spreader configured to thermally couple to a surface of a heat generating component of the electronic device. The heat generating component, e.g., an integrated circuit chip, has a non-uniform thermal distribution across the surface thereof between at least one first region of the surface and at least one second region of the surface, with the at least one first region having a higher heat flux than the at least one second region. The subassembly further includes at least one thermoelectric device aligned to at least a portion of each first region having the higher heat flux, wherein the at least one thermoelectric device facilitates dissipation of the higher heat flux. In one embodiment, one or more thermoelectric devices are embedded within the thermal spreader and thermally isolated therefrom.

19 Claims, 4 Drawing Sheets fig. 1 fig. 2A fig. 2B fig. 3A fig. 3B fig. 4A fig. 4B

THERMOELECTRIC-ENHANCED HEAT SPREADER FOR HEAT GENERATING COMPONENT OF AN ELECTRONIC DEVICE

CROSS-REFERENCE TO RELATED APPLICATION

This application contains subject matter which is elated to the subject matter of the following co-filed application, which is assigned to the same assignee as this application. The below-listed application is hereby incorporated herein by reference in its entirety:

"THERMAL SPREADER AND INTERFACE ASSEMBLY FOR HEAT GENERATING COMPONENT OF AN ELECTRONIC DEVICE," by Chu et al., Ser. No. 09/606,619,

TECHNICAL FIELD

The present invention is directed to cooling assemblies and other apparatus used for removing heat from electronic devices. More particularly, the present invention is directed to an apparatus for cooling an electronic module through the selective utilization of thermoelectric cooling elements. Even more particularly, this invention is directed to a thermal spreading plate having at least one thermoelectric cooling element associated with only a portion thereof. The at least one thermoelectric cooling element is positioned to align to an area of higher heat flux on a surface of the heat generating element to be cooled.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause for failure of chip devices. Furthermore, it is anticipated that the demand for heat removal from these devices will increase indefinitely. Accordingly, it is seen that there is a large and significant need to provide useful cooling mechanisms for electronic circuit devices.

The use of large thermoelectric cooling elements is known. These elements operate electronically to produce a cooling effect. By passing a direct current through the legs of a thermoelectric device, a temperature difference is produced across the device which may be contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water). When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

DISCLOSURE OF THE INVENTION

Conventional configurations of large thermoelectric assemblies are nonetheless seen herein to be unnecessarily limiting in terms of their application to the transfer of thermal energy. Thus, while the use of thermoelectric devices is seen to provide a means for the solid state cooling of adjacent electrical devices, their efficiency has been less than optimal.

In addition, complementary metal oxide semiconductor (CMOS) semiconductor processing has progressed to the point where multiple logic units (such as processors) and their associated control and support circuits (e.g., memory) are being placed on a single integrated circuit chip. From a thermal viewpoint, this results in a chip with a highly non-uniform heat flux distribution. A relatively high heat flux is generated in the processor core region(s) and a relatively low heat flux is produced by the control/support regions. In fact, the core region heat flux can be as much as fifteen times greater than that of the other regions. Thermal paste conduction cooling schemes are not well suited to handle such disparate fluxes. They result in an equally disparate circuit temperature distribution, and more importantly, a much higher absolute junction temperature within the high heat flux regions.

To summarize the present invention, therefore, provided herein in one aspect is thermal dissipation subassembly for facilitating cooling of an electronic device, such as a module. The thermal dissipation subassembly includes a thermal spreader which is configured to thermally couple to a surface of a heat generating component. The heat generating component has a non-uniform thermal distribution across the surface between at least one first region of the surface and at least one second region of the surface. The at least one first region has a higher heat flux than the at least one second region. The thermal dissipation subassembly further includes at least one thermoelectric device aligned to at least a portion of the at least one first region of the surface having the higher heat flux, wherein the at least one thermoelectric device facilitates dissipation of the higher heat flux.

In another aspect, the present invention comprises an electronic device including a heat generating component having a non-uniform thermal distribution across a surface thereof between at least one first region of the surface and at least one second region of the surface, with the at least one first region having a higher heat flux than the at least one second region. The electronic device further includes a thermal dissipation subassembly having a thermal spreader and at least one thermoelectric device. The thermal spreader thermally couples to the surface of the heat generating component, and the at least one thermoelectric device aligns to at least a portion of the at least one first region having the higher heat flux, wherein the at least one thermoelectric device facilitates dissipation of the higher heat flux.

In a further aspect, a method of fabricating a thermal dissipation subassembly for an electronic device is presented. The method includes: providing a thermal spreader configured to thermally couple to a surface of a heat generating component of the electronic device, the heat generating component having a non-uniform thermal distribution across the surface between at least one first region of the surface and at least one second region of the surface, wherein the at least one first region has a higher heat flux than the at least one second region; and disposing at least one thermoelectric device over the surface having the thermal spreader coupled thereto and aligned to at least a portion of the first region having the higher heat flux, wherein the at least one thermoelectric device facilitates dissipation of the higher heat flux.

To restate, provided herein is a thermoelectric-enhanced heat spreader subassembly useful in cooling a heat generating component such an integrated circuit chip. One or more thermoelectric cooling units, which are embedded within or reside adjacent to a thermal spreader plate, are aligned to selected regions of higher heat flux of the heat generating component. By selectively using thermoelectric cooling units only where needed, enhanced thermal performance is obtained while limiting costs associated with that performance. The thermoelectric cooling units are unidirectional heat transfer devices, while the thermal spreader plate spreads heat radially to regions of lower power. Heat can ultimately be dissipated through an electronic module cap or heat sink disposed adjacent to the thermal spreader and thermoelectric unit subassembly. A subassembly in accordance with the present invention allows handling of high heat flux zones on a component, such as an integrated circuit component, while cooling the entire chip to acceptable temperatures thereby establishing a more uniform temperature distribution on the component. This advantageously facilitates integrated circuit design and operation.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, provided herein is a thermoelectric-enhanced heat spreader subassembly for facilitating cooling within an electronic device, such as an electronic module. The subassembly is configured to thermally couple to a heat generating component, such as an integrated circuit chip, disposed within the electronic device. The subassembly employs one or more thermoelectric cooling units either embedded within a thermal spreading plate or thermally coupled to a thermal spreading plate. The thermoelectric cooling units are aligned to known regions of high heat flux on a surface of the heat generated component. Although the thermoelectric-enhanced heat spreader subassembly can be attached to any heat source for the purpose of facilitating heat removal, the subassembly is advantageously employed with a heat generating component having a non-uniform thermal distribution across a surface thereof to which the subassembly is to be thermally coupled.

Figure 1:
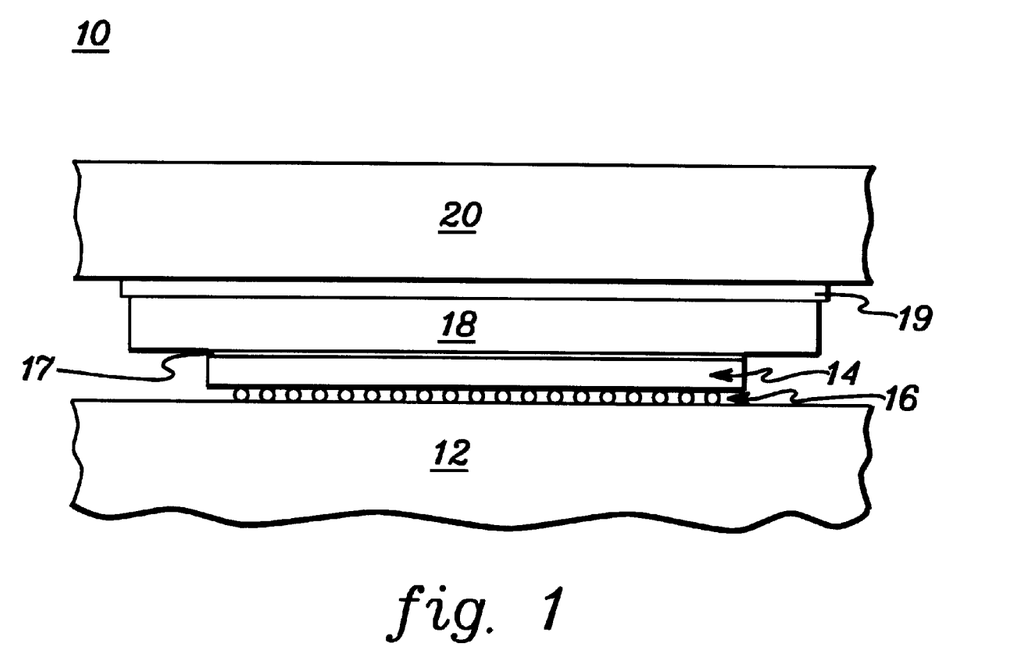
FIG. 1 is a partial elevational view illustrating one embodiment of an electronic module employing a thermal spreading plate.

FIG. 1 depicts one embodiment of an electronic device, generally denoted 10, having a high thermal conductivity plate 18 disposed between an integrated circuit chip 14 and a thermally conductive cap 20. Plate 18 is thermally coupled to cap 20 via a thermal paste 19, and a solder or oil interface 17 may exist between plate 18 and chip 14 to enhance thermal conductivity therebetween. Chip 14 may be electrically connected 16 to one or more conductive planes (not shown) within substrate 12. Thermal spreader plate 18, which for example may comprise a monolithic piece of high thermal conductivity material, improves the heat removal capability of the system. When used to reduce peak device temperature on a highly non-uniform heat flux chip, the interface resistance between the thermal spreader plate and the chip must be considerably lower than that of a conventional paste gap approach. Table 1 shows that an oil or solder interface can meet this requirement.

TABLE 1

| Interface | Relative Thermal Resistance |
|---|---|
| 7 mils ATC 4.5 paste (90% Coverage) | 22 |
| 20 mils Eutectic PbSn Solder | 5 |
| 1 um PAO Oil | 2.8 |
| 4 mils Eutectic PbSn Solder | 1 |

Figure 2A:
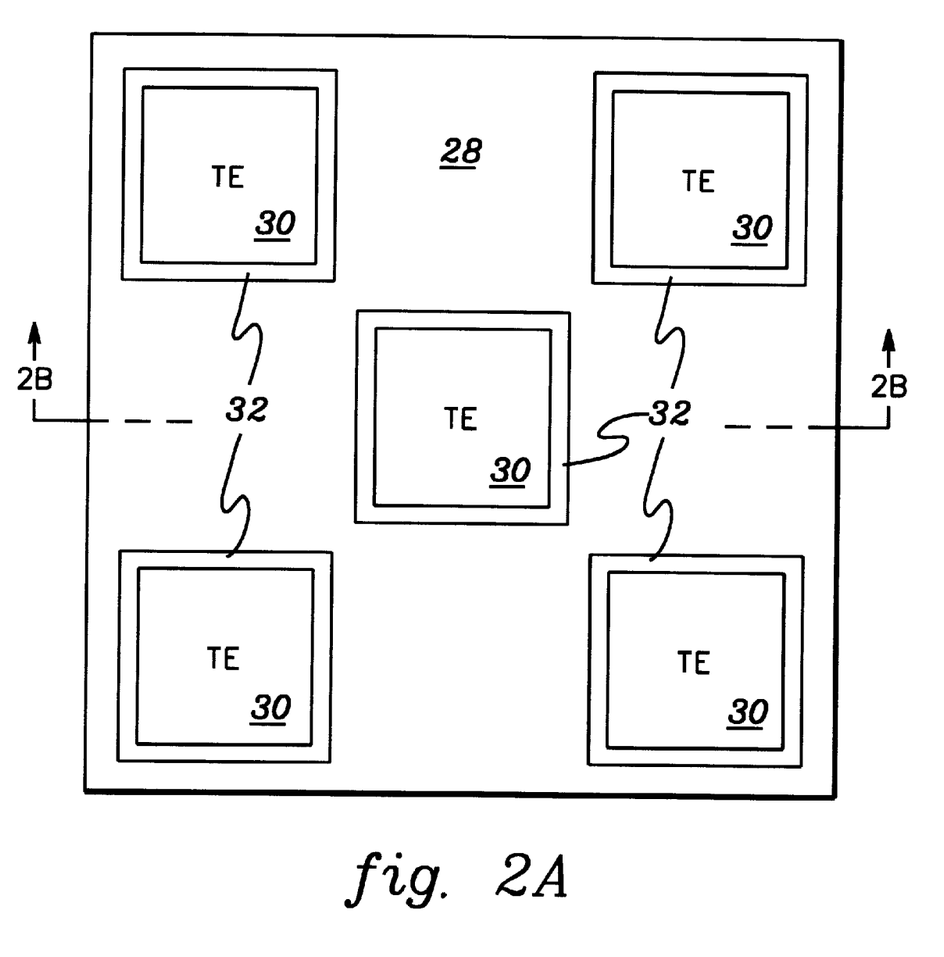
FIG. 2A is a plan view of one embodiment of a thermal spreading plate and thermoelectric cooler subassembly in accordance with the principles of the present invention.
Figure 2B:
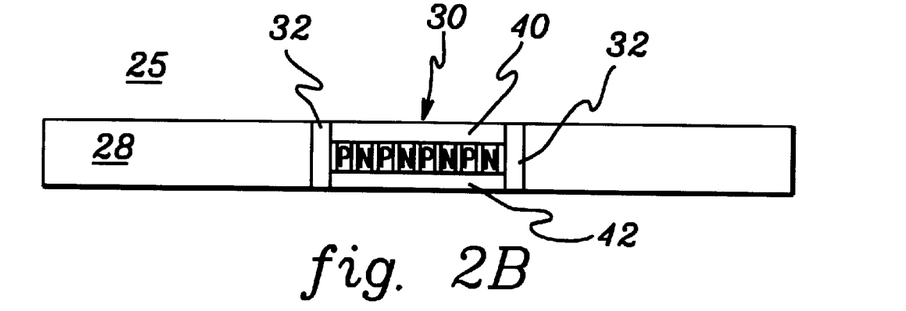
FIG. 2B is a cross-sectional view of the subassembly of FIG. 2A taken along lines 2B—2B.
Figure 3A:
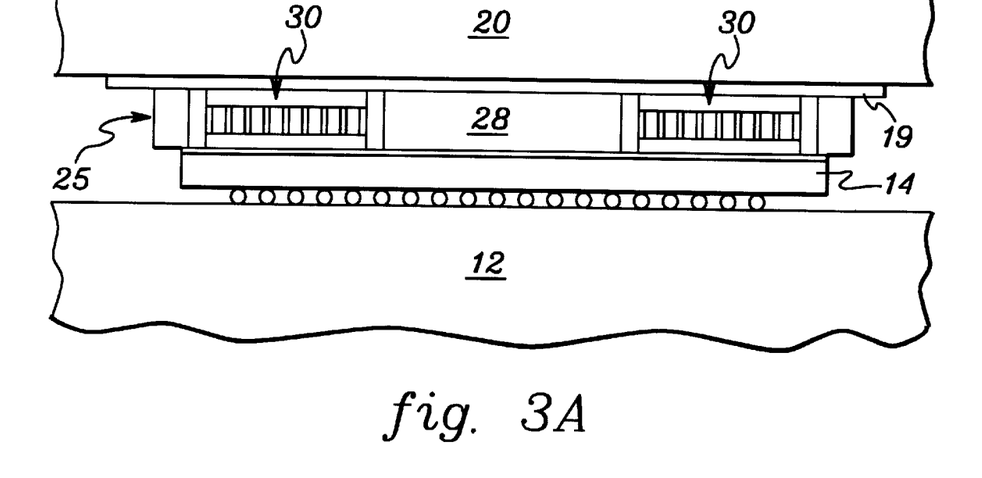
FIG. 3A is a partial elevational view illustrating one embodiment of an electronic device employing a thermoelectric-enhanced heat spreader subassembly in accordance with the principles of the present invention.
Figure 3B:
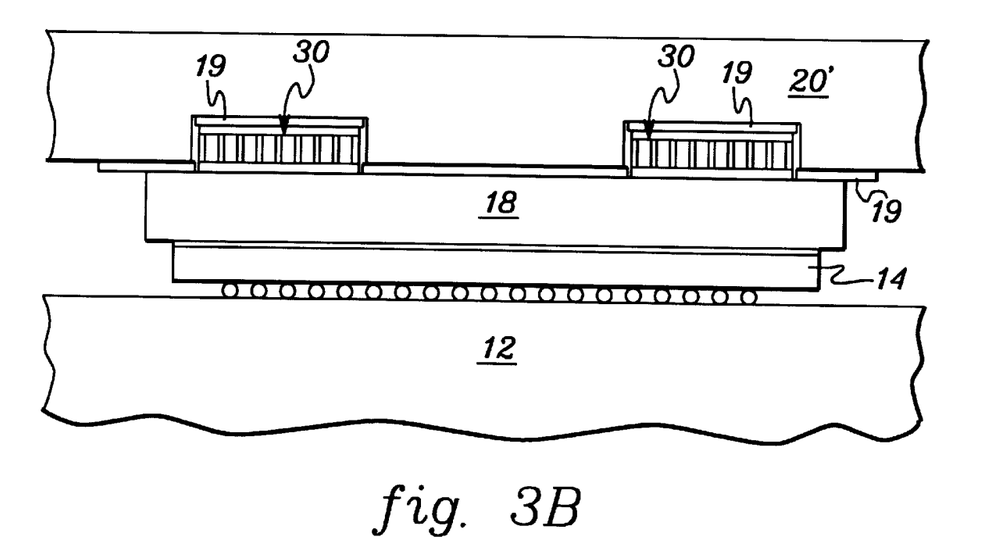
FIG. 3B is a partial elevational view illustrating an alternate embodiment of an electronic device and thermoelectric-enhanced heat spreader subassembly in accordance with the principles of the present invention.
Figure 4A:
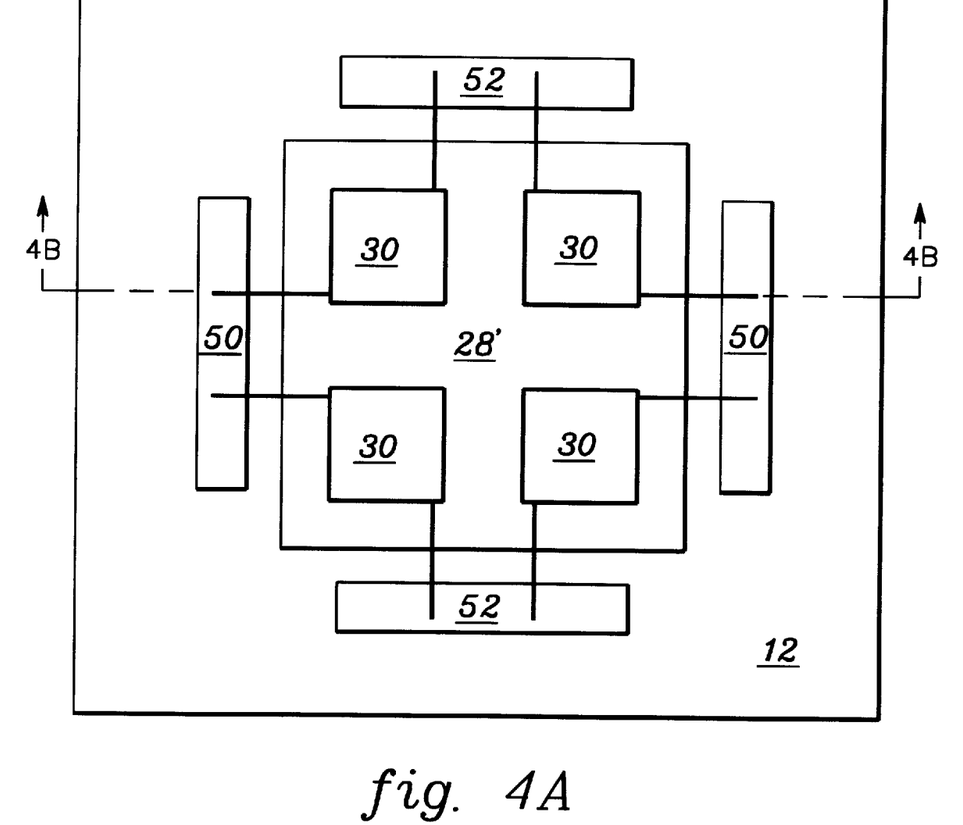
FIG. 4A is a plan view of one embodiment of an electronic device employing a thermoelectric-enhanced heat spreader device in accordance with the principles of the present invention and illustrating connection of power and ground leads to the thermoelectric cooling units employed therein.
Figure 4B:
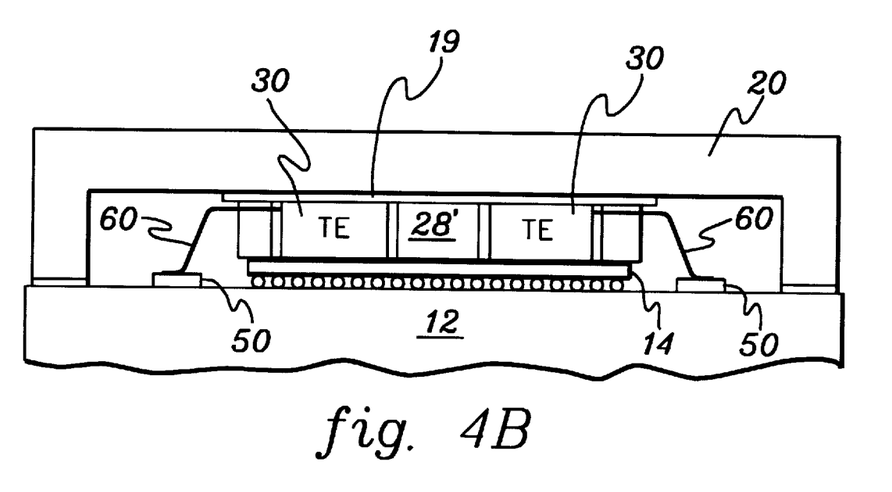
FIG. 4B is a cross-sectional view of the electronic device of FIG. 4A taken along lines 4B—4B and after a cap has been secured thereto.

The approach of FIG. 1 provides limited performance, however, particularly in multichip modules where chip-to-chip spacing may be only a few millimeters. FIGS. 2–4 describe alternate structures which improve upon the basic thermal spreader concept of FIG. 1 by selectively coupling thermoelectric cooling units with the spreader plate to achieve a reduction in peak temperatures greater than can be realized by the plate alone.

FIGS. 2A & 2B depict one embodiment of a thermoelectric-enhanced heat spreader subassembly 25 in accordance with the principles of the present invention. In this embodiment, subassembly 25 includes multiple thermoelectric (TE) cooling units 30 embedded within openings formed in the thermal spreader plate 28. Five thermoelectric cooling units are shown by way of example. Those skilled in the art will note that one or more TE cooling units 30 could be included depending upon thermal distribution across the heat generating component with which the subassembly is to be employed. In this example, it is assumed that the heat generating component has five distinct areas of higher heat flux and the TE cooling units are sized and aligned to reside at least partially over those five distinct areas. The remaining regions of the heat generating component are assumed to have a lower heat flux.

As noted above, it is well known that by passing direct current through a series of thermoelectric couples, one side of the thermoelectric will transfer heat to the other side. Essentially, heat is "electronically" pumped from the cold side to the hot side. In the embodiment of FIGS. 2A & 2B, the cold side 42 of each thermoelectric cooling unit is coplanar with the lower surface of thermal spreader plate 28, while the hot side 40 is coplanar with an upper surface of plate 28. Each thermoelectric cooling unit includes an array of p and n type couples which are embedded within the heat transfer surfaces of the thermoelectric units. Again, each thermoelectric device is sized and located to align above a known high heat flux region of the chip to be cooled.

Thermal spreader plate 28 in (one embodiment) may be fabricated of a high thermal conductivity metal, such as copper, or a high thermal conductivity ceramic, such as aluminum nitride. A foam insulation wall 32 is disposed to surround and thermally isolate each thermoelectric cooling unit from the spreader plate 28. This thermal isolation minimizes direct heat leakage from the spreader plate to the thermoelectric cooling units. Without thermal isolation, the effective thermal conductivity path from the hot side to the cold side of the thermoelectric cooling unit would increase, thereby lowering performance or effectiveness of the thermoelectric unit. Note that the subassembly presented herein includes both unidirectional heat transfer and radially directed heat transfer. Unidirectional heat transfer is performed by the thermoelectric cooling units, while radial heat transfer is performed by the thermal spreader plate. Together, the plate and thermoelectric cooling units are designed to achieve a more uniform cooling of a heat generating component having a non-uniform thermal distribution.

FIGS. 3A & 3B depict alternate embodiments of an electronic device employing a thermoelectric-enhanced heat spreader subassembly in accordance with the principles of the present invention. In FIG. 3A, the electronic device includes a subassembly 25 such as depicted in FIGS. 2A & 2B. Subassembly 25 is disposed between a heat dissipating component, such as an integrated circuit chip 14, and a heat sink 20 or a thermally conductive cap of an electronic module. A thermally conductive paste 19 couples subassembly 25 to cap 20, and a thin layer of oil or solder operates as a thermal interface between subassembly 25 and chip 14. Chip 14 resides on a substrate 12.

As noted above with respect to FIGS. 2A & 2B, subassembly 25 includes a thermal spreader plate 28 having embedded therein one or more thermoelectric cooling units 30. Cooling units 30 are thermally isolated from spreader plate 28 via an appropriate thermal insulation material. In one embodiment, this material may comprise a foam insulation. Those skilled in the art will note that the thermoelectric cooling units and the thermal spreader plate are effectively thermally in parallel with one another. Further, the thermoelectric cooling units serve to improve, or boost, the heat transfer to the cap or heat sink disposed above the subassembly in the high heat flux regions of the heat generating component (e.g., integrated circuit chip) where the transfer is most needed. The net effect is to bring down the maximum circuit device temperature since the generated heat flux is more effectively transferred away from the chip.

FIG. 3B depicts an alternate electronic device embodiment employing a thermoelectric-enhanced heat spreader subassembly in accordance with the principles of the present invention. In this embodiment, one or more thermoelectric cooling units 30 are thermally coupled to a thermal spreader plate 18 and are aligned over those regions of chip 14 dissipating higher amounts of heat. To accommodate the thermoelectric cooling units, channels are formed within cap 20' where the thermoelectric units are to be placed when the electronic device is assembled as shown. A thermal paste 19 resides between thermal spreader plate 18 and cap 20', as well as between an upper surface of thermoelectric cooling units 30 and cap 20'. A mechanical gap is provided around and between the thermoelectric units and the surrounding cap wall. This air gap performs the thermal isolation function achieved by the foam insulation wall in the embodiment of FIG. 3A.

An operational issue involves providing electrical power to the thermoelectric units located within the electronic device having the at least one component to be cooled. FIGS. 4A & 4B depict one embodiment for providing power and ground connections to the thermoelectric units. In the embodiment of FIG. 4A, four thermoelectric cooling units 30 are embedded within a spreader plate 28' as shown. Power to units 30 is provided through pads 50, while ground connections are through pads 52. Pads 50 & 52 can be connected to power and planes, respectively, which are assumed to be disposed within substrate 12 in a manner well known in the art. If necessary, channels can be formed within thermal spreader plate 28' to accommodate the wiring of the thermoelectric cooling units. Since the lead wires may be 26 AWG in size, a 0.6 mm square groove would be sufficient to accommodate the electrical connectors. During assembly, the wires could be attached to the appropriate substrate pads in a manner similar to that used to bond EC wires. In FIG. 4B, the electronic device is completed when cap 20 is sealed to substrate 12.

Those skilled in the art will note from the above discussion that provided herein is an enhanced heat dissipation subassembly which includes at least one thermoelectric cooling unit and a heat spreader. The at least one thermoelectric cooling unit is aligned to a region of high heat flux on the heat generating component to be cooled, while the heat spreader dissipates heat from at least one region of lower heat flux on the component. A thermoelectric-enhanced heat spreader subassembly in accordance with the present invention can be readily designed for a specific heat generating component, e.g., integrated circuit chip, to achieve optimal temperature distribution on the component while minimizing cooling costs. Since the regions of high heat flux are readily ascertainable by one skilled in the art for a,given heat generating component, the subassembly can be configured to allow disposition of the thermoelectric cooling units where most beneficial.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is :

1. A thermal dissipation subassembly for an electronic device, said thermal dissipation subassembly comprising:
    a thermal spreader having a main surface thermally coupled to a surface of a heat generating component, said main surface of said thermal spreader having a larger surface area than a surface area of said surface of said heat generating component, said heat generating component having a non-uniform thermal distribution across said surface between at least one first region of said surface and at least one second region of said surface, wherein said at least one first region has higher heat flux than said at least one second region; and at least one thermoelectric device comprising a discrete device having a plurality of thermoelectric couples, said at least one thermoelectric device also having a cooling surface with a smaller surface area than the surface area of said surface of the heat generating component, and wherein said cooling surface of said at least one thermoelectric device is similarly sized as or is smaller than said at least one first region and is positioned over said at least one first region having said higher heat flux to facilitate dissipation of said higher heat flux.

2. The thermal dissipation subassembly of claim 1, wherein said at least one thermoelectric device is embedded within said thermal spreader.

3. The thermal dissipation subassembly of claim 2, wherein said at least one thermoelectric device is disposed within at least one opening in said thermal spreader extending from a first main surface thereof to a second main surface thereof, wherein said main surface comprises one of said first main surface or said second main surface.

4. The thermal dissipation subassembly of claim 3, wherein said at least one thermoelectric device is thermally isolated from said thermal spreader.

5. The thermal dissipation subassembly of claim 4, wherein a thermal insulation ring surrounds said at least one thermoelectric device within said at least one opening in said thermal spreader to provide said thermal isolation thereof.

6. The thermal dissipation subassembly of claim 1, wherein said thermal spreader comprises a thermal spreading plate and wherein said at least one thermoelectric device is embedded within and extends through said thermal spreading plate, with an upper surface of said at least one thermoelectric device being coplanar with a first main surface of said thermal spreading plate and a lower surface of said at least one thermoelectric device being coplanar with a second main surface of said thermal spreading plate, and wherein said lower surface of said at least one thermoelectric device comprises said cooling surface, and said second main surface of said thermal spreading plate comprises said main surface thereof.

7. The thermal dissipation subassembly of claim 6, wherein said heat generating component comprises an integrated circuit chip, and wherein said electronic device further comprises at least one of a thermally conductive cap or a heat sink, said thermal spreading plate with said at least one thermoelectric device embedded therein is disposed between said integrated circuit chip and said at least one thermally conductive cap or heat sink.

8. The thermal dissipation subassembly of claim 1, wherein said thermal spreader is disposed between said at least one thermoelectric device and said heat generating component.

9. The thermal dissipation subassembly of claim 8, further comprising at least one of a thermally conductive cap or a heat sink thermally coupled to said at least one thermoelectric device and said thermal spreader for removing heat therefrom.

10. The thermal dissipation subassembly of claim 9, wherein said at least one thermoelectric device is at least partially embedded within said at least one thermally conductive cap or heat sink.

11. The thermal dissipation subassembly of claim 1, wherein the electronic device comprises an integrated circuit chip positioned on a substrate, and wherein the electronic device further comprises a cap disposed over said thermal dissipation subassembly and said integrated circuit chip on said substrate.

12. An electronic device comprising:

a heat generating component having a non-uniform thermal distribution across a surface thereof between at least one first region of said surface and at least one second region of said surface, wherein said at least one first region has higher heat flux than said at least one second region; and a thermal dissipation subassembly comprising:

a thermal spreader having a main surface thermally coupled to said surface of said heat generating component, said main surface of said thermal spreader having a larger surface area than a surface area of said surface of said heat generating component; and at least one thermoelectric device comprising a discrete device having a plurality of thermoelectric couples, said at least one thermoelectric device also having a cooling surface with a smaller surface area than the surface area of said surface of the heat generating component, and wherein said cooling surface of said at least one thermoelectric device is thermally coupled to at least one of said thermal spreader and said surface of said heat generating component, and is smaller than or similarly sized as said at least one first region and is positioned over said at least one first region having said higher heat flux to facilitate dissipation of said higher heat flux.

13. The electronic device of claim 12, wherein said heat generating component comprises an integrated circuit chip mounted on a substrate, and wherein said electronic device further comprises at least one of a thermally conductive cap or a heat sink surrounding said integrated circuit chip on said substrate with said thermal dissipation subassembly disposed between said integrated circuit chip and said at least one thermally conductive cap or heat sink.

14. The electronic device of claim 13, further comprising at least one power pad disposed on an upper surface of said substrate adjacent to said integrated circuit chip, and at least one ground pad disposed on said upper surface of said substrate adjacent to said integrated circuit chip, and wherein said at least one thermoelectric device further comprises conductive wiring electrically connecting said at least one thermoelectric device to said power pad and to said ground pad.

15. The electronic device of claim 14, wherein said power pad is electrically connected to a power plane within said substrate, and wherein said ground pad is electrically connected to a ground plane within said substrate.

16. The electronic device of claim 12, wherein said at least one thermoelectric device is embedded within said thermal spreader.

17. The electronic device of claim 16, wherein said at least one thermoelectric device is thermally isolated from said thermal spreader.

18. A method of fabricating a thermal dissipation subassembly for an electronic device, said method comprising:

thermally coupling a main surface of a thermal spreader to a surface of a heat generating component of the electronic device, said main surface of said thermal spreader having a larger surface area than a surface area of said surface of said heat generating component, said heat generating component having a non-uniform thermal distribution across said surface between at least one first region of said surface and at least one second region of said surface, wherein said at least one first region has a higher heat flux than said at least one second region; and providing at least one thermoelectric device comprising a discrete device having a plurality of thermoelectric couples, said at least one thermoelectric device also having a cooling surface with a smaller surface area than the surface area of said surface of the heat generating component to which the thermal spreader is thermally coupled, said cooling surface being smaller than or similarly sized as said at least one first region, and thermally coupling said cooling surface of said at least one thermoelectric device to at least one of said thermal spreader and said surface of said heat generating component, wherein said thermally coupling includes positioning said at least one thermoelectric device over said at least one first region having said higher heat flux to facilitate dissipation of said higher heat flux.

19. The method of claim 18, wherein said disposing comprises embedding said at least one thermoelectric device within said thermal spreader, and thermally isolating said at least one thermoelectric device from said thermal spreader.

* * * * *

UNITED STATES PATENT AND TRADEMARK OFFICE
CERTIFICATE OF CORRECTION

PATENT NO. : 6,424,533 B1 Page 1 of 1
DATED : July 23, 2002
INVENTOR(S) : Chu et al.

It is certified that error appears in the above-identified patent and that said Letters Patent is hereby corrected as shown below:

Column 1,
Line 8, delete "elated" and insert -- related --

Signed and Sealed this

Tenth Day of September, 2002

Attest:

Attesting Officer

JAMES E. ROGAN
Director of the United States Patent and Trademark Office